United States Patent [19]
Iida

[11] 4,246,499
[45] Jan. 20, 1981

[54] PULSE GENERATING CIRCUIT
[75] Inventor: Takahiko Iida, Itami, Japan
[73] Assignee: Mitsubishi Denki Kabushiki Kaisha, Tokyo, Japan
[21] Appl. No.: 794
[22] Filed: Jan. 3, 1979

Related U.S. Application Data

[63] Continuation-in-part of Ser. No. 779,771, Mar. 21, 1977, abandoned.

[30] Foreign Application Priority Data

| Mar. 26, 1976 | [JP] | Japan | 51/36443 |
| Mar. 26, 1976 | [JP] | Japan | 51/36444 |
| Apr. 15, 1976 | [JP] | Japan | 51/47382 |
| Jun. 22, 1976 | [JP] | Japan | 51/82581 |

[51] Int. Cl.³ ............................................. H03K 17/00
[52] U.S. Cl. ..................................... 307/293; 307/246; 307/252 J; 307/260
[58] Field of Search ............... 307/293, 294, 301, 260, 307/252 J, 252 A, 246

[56] References Cited

U.S. PATENT DOCUMENTS

| 2,968,770 | 1/1961 | Sylvan | 307/301 |
| 3,059,129 | 10/1962 | Tottingham | 307/293 |
| 3,131,318 | 4/1964 | Snyder et al. | 307/252 J |
| 3,191,066 | 6/1965 | Staydemayer | 307/293 |
| 3,872,405 | 3/1975 | Gotou et al. | 307/252 F |

Primary Examiner—Stanley D. Miller, Jr.
Assistant Examiner—B. P. Davies
Attorney, Agent, or Firm—Oblon, Fisher, Spivak, McClelland & Maier

[57] ABSTRACT

A pulse generating circuit comprises means for charging from a DC power source through a resistor for charge to a capacitor; means for detecting a predetermined value of charge of the capacitor and triggering a main thyristor to discharge the charge of the capacitor through the main thyristor and means for generating the pulse output to a load by the discharge current.

17 Claims, 9 Drawing Figures

PULSE GENERATING CIRCUIT

CROSS-REFERENCE TO RELATED APPLICATIONS

This application is a continuation-in-part of Application Ser. No. 779,771, filed on Mar. 21, 1977 and now abandoned.

BACKGROUND OF THE INVENTION

1. Field of the Invention

The present invention relates to an improvement of a pulse generating circuit for generating steep pulse output by rapidly discharging a charge of a capacitor.

2. Description of Prior Art:

In order to generate spark for firing a flash bulb for photography, a gas lighter or a stove, pulse generating circuits having relatively simple structure which discharge charge of a capacitor to generate steep pulse output by the discharge current have been used.

FIG. 1 is a circuit diagram of one embodiment of the conventional pulse generating circuit.

In FIG. 1, the reference numeral (1) designates a DC power source such as a dry battery (9 to 12 volts); (2) designates a starting switch; (3) designates a resistor for charge; (4) designates a capacitor; (5) designates a trigger element; (6) designates a thyristor; (7) designates a load and (8) and (9) designate output terminals.

The operation of the circuit will be described.

When the starting switch (2) is turned on, the capacitor (4) is charged by the DC power source (1) through the switch (2) and the resistor (3) for charge. The time constant for charge is given by the resistance of the resistor (3) and the capacitance of the capacitor (4). When the charged voltage of the capacitor (4) reaches to the switching voltage ($E_s$) of the trigger element (5), the trigger element (5) is turned on to feed the trigger signal to the gate of the thyristor (6) to turn on the thyristor. As the result, the charge of the capacitor (4) is discharged through the load resistor (7) and the thyristor (6) whereby the pulse output is generated between the output terminals (8), (9) of both ends of the load resistor (7).

FIG. 2 shows the voltage waveform of the capacitor (4) in such operation mode. The charging operation is initiated at the time of turning on the switch (2).

When the charged voltage reaches the switching voltage ($E_s$) of the trigger element at the point ($t_1$), the charge is immediately discharged to be zero, and the thyristor (6) is immediately turned off after the discharge. Accordingly, the charging operation of the capacitor (4) initiates again. The operation is repeated.

Accordingly, as shown in FIG. 2, the charge and discharge are repeated in a cycle of period $t_1$ given by the specific switching voltage ($E_s$) in ON state of the switch (2) whereby the pulse output is continuously obtained between the output terminals (8), (9).

However, in the circuit, the initiation of discharge is decided by the specific switching voltage ($E_s$) given by the trigger element (5). If the voltage of the power source (1) decreases to be incapable of charging to the specific switching voltage ($E_s$), the discharge is not caused and the pulse output cannot be obtained. This is the fatal disadvantage.

Accordingly, when the voltage of the DC power source (1) is highly varied, the switching voltage ($E_s$) of the trigger element (5) should be set in relatively low voltage under the consideration of the variation. Accordingly, the voltage of the pulse output is decreased to be difficult to obtain the output voltage being proportional to the voltage of the DC power source (1). Moreover, if the voltage of the DC power source (1) is decreased below the switching voltage ($E_s$), the output is not given. It is difficult to discriminate the phenomenon from the failure of the circuit and to find the cause of the non-output.

SUMMARY OF THE INVENTION

It is an object of the present invention to provide an improved pulse generating circuit.

Another object of the present invention is to provide a pulse generating circuit for generating the output being proportional to the voltage of the power source without failure even though the voltage of the power source is varied.

The other object of the present invention is to provide a pulse generating circuit for generating the output pulse under detecting the time when the capacitor is charged to the voltage being substantially the same with the voltage of the power source.

The other object of the present invention is to provide a pulse generating circuit for generating the output pulse in a stable period which is adjustable.

The foregoing and other objects of the present invention have been attained by serially inserting a base-emitter circuit of a transistor into the circuit for charging a capacitor whereby the phenomenon for turning off the transistor by decreasing or disappearing the charging current for the capacitor at the time of completing the charge of the capacitor. This is a charging current detection type.

BRIEF DESCRIPTION OF THE DRAWINGS

Various objects, features and attendant advantages of the present invention will be more fully appreciated as the same becomes better understood from the following detailed description of the present invention when considered in connection with the accompanying drawings in which.

DETAILED DESCRIPTION OF THE PREFERRED EMBODIMENTS

Figure 1:
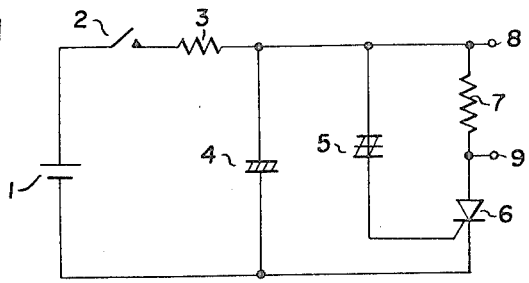
FIG. 1 is a circuit diagram of the conventional pulse generating circuit.
Figure 2:
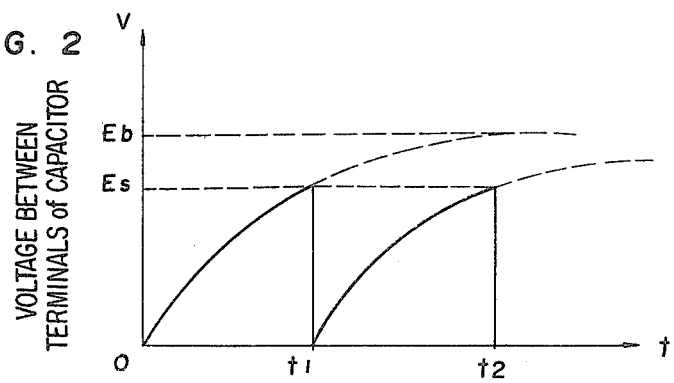
FIG. 2 is a performance chart showing a voltage waveform of a capacitor in the operation mode of the circuit of FIG. 1.
Figure 3:
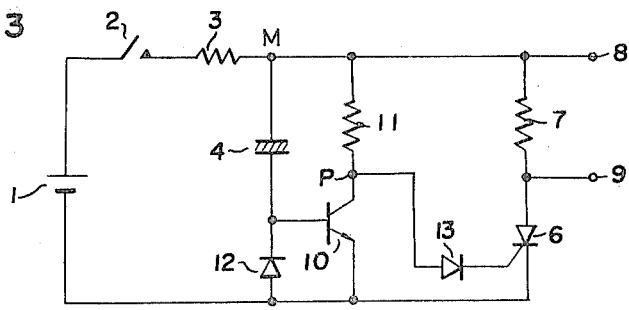
FIGS. 3 to 9 are respectively various embodiments of the pulse generating circuits according to the present invention.

FIG. 3 is a circuit diagram of one embodiment of the pulse generating circuit of the present invention.

In FIG. 3, the DC power source (1) is connected in series to the starting switch (2), the resistor for charge (3), the capacitor (4) and the base-emitter of the NPN transistor (10). A cathode of a diode (12) is connected to the base of the transistor (10) and an anode of the diode (12) is connected to the emitter of the transistor (10). A resistor (11) is connected between the contact (M) of the collector of the transistor and the resistor for charge (3) and the capacitor (4). A series connection of the thyristor (6) and the load resistor (7) is connected between the emitter of the transistor (10) and the contact (M) of the resistor for charge (3) and the capacitor (4), and the output terminals (8), (9) are lead from both ends of the load resistor (7).

Between the gate of the thyristor (6) and the contact (P) of the resistor (11) and the collector of the transistor (10), the cathode of the diode (13) is connected to the gate of the thyristor (6).

The operation of the circuit will be described.

When the starting switch (2) is turned on, the capacitor (4) is charged from the DC power source (1) through the starting switch (2), the resistor for charge (3), the capacitor (4) and the base-emitter of the transistor (10) whereby the transistor (10) is switched to a saturated conducting state and the collector current is fed from the DC power source (1) through the resistor (11).

At the time, the potential at the contact (P) is the barrier voltage of the transistor (10) such as about 0.5 V. However, the barrier voltage of the diode (13) is preset to be 0.7 V whereby no current is fed to the gate of the thyristor (6) and the thyristor is not triggered.

Thus, when the capacitor (4) is charged to become substantially equal to the voltage of the DC power source (1), the charging current is not fed whereby the base current is not fed to the transistor (10) to be turned off. As the result, the potential at the point (P) rises to the potential at the point (M) that is the charged potential of the capacitor (4). The raised potential is remarkably higher than the barrier voltage of the diode (13) whereby the gate trigger current is fed to the gate of the thyristor (6) and the thyristor (6) is triggered and the charge of the capacitor (4) is discharged through the load resistor (7).

The charged voltage of the capacitor (4) becomes substantially the same with the voltage of the DC power source (1). When the charging current becomes substantially zero, the thyristor (6) is turned on to generate the output pulse having a value substantially equal to the voltage of the DC power source (1) to the both output terminals (8), (9) of the load resistor (7).

The load resistor (7) is not limited to a resistor and can be replaced to a primary winding of a boosting transformer so as to include high voltage in the secondary winding and the stable spark can be generated. This can be effectively used for a firing device of a gas lighter.

Figure 4:
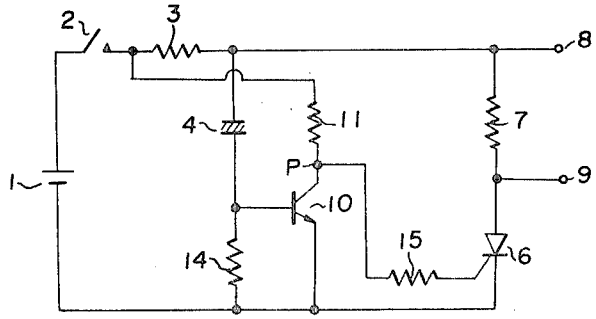

FIG. 4 shows another embodiment modified from that of FIG. 3 wherein the resistors (14), (15) are used instead of the diodes and one end of the resistor (11) is connected to the contact (N) of the switch (2) and the resistor for charge (3).

The principle of the operation of the circuit is substantially the same with that of FIG. 3 except that the collector current of the transistor (10) can be decided by the resistor (11) regardless of the resistor for charge (3).

Figure 5:
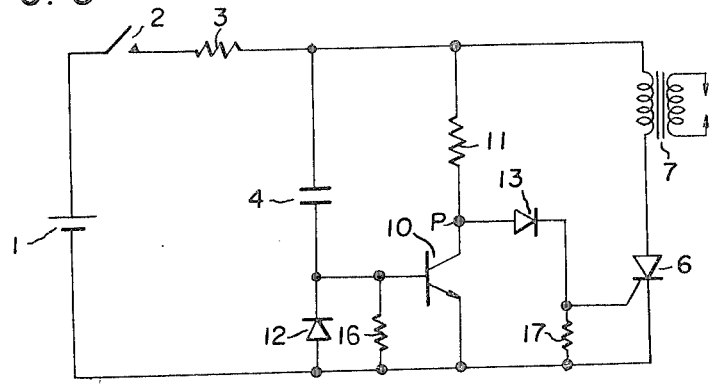

FIG. 5 shows the other embodiment modified from those of FIGS. 3 and 4. In the circuits of FIGS. 3 and 4, the charging current of the capacitor (4) is remarkably small near the finish of the charging operation whereby the time for switching the transistor from ON state to OFF state that is the pulse generation period is unstable. Only when the charge of the capacitor (4) is completed, the output pulse is given between the terminals (8), (9). The output pulse cannot be obtained at a desired time during the charging operation. The pulse generating period is given by the product of the resistance of the resistor (3) and the capacitance of the capacitor (4), and it cannot be adjusted by the other means.

Accordingly, in the embodiment of FIG. 5, a pulse period adjusting resistor (16) is connected between the base-emitter of the transistor (10). A resistor (17) is connected between the gate-cathode of the thyristor (6) for protecting the thyristor (6).

The operation of the circuit will be described.

When the starting switch (2) is turned on, the charging current is fed from the DC power source (1) through the resistor for charge (3), the capacitor (4) and the pulse period adjusting resistor (16). When the voltage drop of the pulse period adjusting resistor (16) is higher than the barrier voltage of 0.5 V, a part of the charging current is fed in shunt to the base-emitter of the transistor (10) to switch the transistor (10) to a saturated conducting state. When the capacitor is substantially charged to decrease the charging current and the voltage drop of the pulse period adjusting resistor (16) reached to less than 0.5 V, the charging current is not fed to the base-emitter of the transistor (10) to turn off the transistor (10).

The pulse having stable pulse generating period can be generated by inserting the pulse period adjusting resistor (16), and the pulse generating period can be freely adjusted by varying the resistance of the resistor (16).

Figure 6:
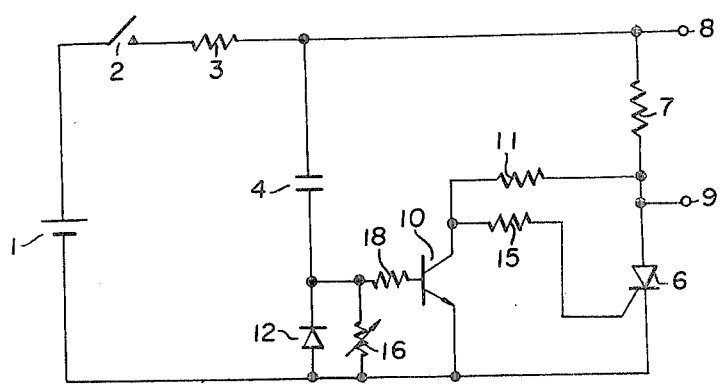

FIG. 6 shows the other embodiment modified from that of FIG. 5, wherein the collector resistance (11) of the transistor (10) is connected to the anode of the thyristor (6) and a resistor (18) is inserted to the base of the transistor (10) to adjust the base current and a resistor (15) is connected instead of the diode (13). It is easily understood that the operation of the embodiment of FIG. 6 can be substantially the same with that of the FIG. 5.

Figure 7:
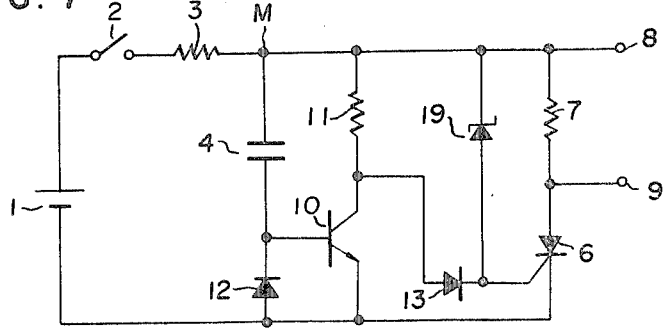

The circuit of FIG. 7 is substantially the same with the circuit of FIG. 3 except inserting a trigger element (19) such as Zener diode between the gate of the thyristor (6) and the contact (M).

In accordance with the structure of FIG. 7, when the capacitor (4) is charged to a predetermined value for generating enough pulse output before charging the capacitor (4) to the high power voltage, the trigger element (19) is turned to feed the trigger current to the thyristor (6).

Figure 8:
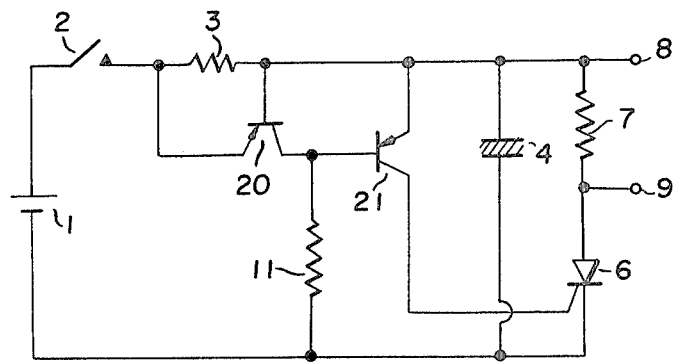

FIG. 8 is a circuit diagram of the other embodiment based on the principle of the invention, wherein emitter-base of PNP transistor (20) are connected between both terminals of the resistor for charge (3), and the collector is connected through the resistor (11) to the negative terminal of the DC power source (1) and emitter-base of PNP transistor (21) are respectively connected to the base-collector of the PNP transistor (20) and the collector of the PNP transistor (21) is connected to the gate of the thyristor (6).

The operation of the circuit will be described.

When the starting switch (2) is turned on, the capacitor (4) is charged from the DC power source (1) through the starting switch (2), the resistor for charge (3) and the capacitor (4). At the same time, forward bias is applied between the emitter-base of the transistor (20) because of the voltage drop by the resistor for charge (3) whereby the transistor (20) is switched to a saturated conducting state. As the result, the voltage being substantially the same with that of the DC power source (1) is applied to both terminals of the resistor (11). On the other hand, the voltage at the emitter terminal of the transistor (21) is lower than the power voltage whereby the reverse bias is applied between the emitter-base of the transistor (21) and the transistor (21) is not turned on. Thus, when the capacitor (4) is charged to give the potential of the emitter of the transistor (21) to be substantially the same with the voltage of the DC power source (1), the base current is not passed through the transistor (20) to turn off the transistor (20). Accordingly, the voltage applied to the resistor (11) disappears to apply forward bias between the emitter-base of the transistor (21) and to feed the gate trigger current of the thyristor (6) whereby the thryistor (6) is turned on to discharge the charge of the capacitor (4) through the load resistor (7) to give the voltage being substantially the same with that of the DC power source (1) between the output terminals (8), (9).

In the circuit, the emitter-base circuit of the transistor (20) is connected in series to the charging circuit for the capacitor (4). When the capacitor (4) is substantially charged to decrease or to disappear the charging current to the capacitor (4), the transistor (20) is turned off to trigger the thyristor (6). The principle of the operation is substantially the same with those of FIGS. 3 to 7.

Figure 9:
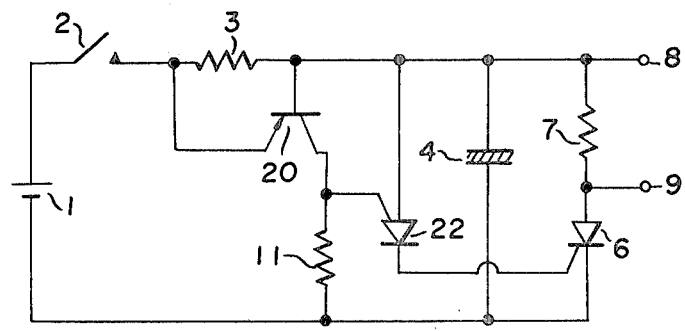

FIG. 9 is the other embodiment modified from that of FIG. 8 wherein the transistor (21) is replaced to a N gate thryistor (22). The anode-gate terminals of the N gate thyristor (22) are respectively connected to the base-collector of the transistor (20) and the cathode terminal is connected to the gate of the thyristor (6).

When the capacitor (4) is not charged enough in the circuit, the reverse bias is applied between the anode-gate of the N gate thyristor (22). When the charged voltage of the capacitor (4) reaches to the power voltage, forward bias is applied to turn on the thyristor (6).

The boost transformer is used as the load (7) in the embodiment of FIG. 5. Thus, it is clearly understood that the boost transformer can be used in the other embodiments.

The pulse generating circuit of the invention is especially effective for the circuit for firing in a gas lighter. In this case, the DC power source (1) is a dry battery having 9 V to 12 V, and the boost transformer is connected as the load (7) to induce high voltage corresponding to the voltage of the dry battery to the secondary winding to generate stable spark.

What is claimed as new and desired to be secured by Letters Patent of the United States is:

1. In a pulse generating circuit for generating a pulse output and applying said pulse output to a load by charging a capacitor from a D.C. power source through a charging resistor and discharging the charge of the capacitor through a switching element that is comprised of a thyristor, an improvement comprising:
    a first transistor connected to said capacitor and to said charging resistor such that said transistor is switched to a saturated conducting state by the charging current of said capacitor, said transistor non-conducting upon completion of charging of said capacitor; and
    trigger means for turning on said switching element when said transistor switches to the non-conducting state, and for preventing triggering of said switching element when said transistor is in the saturated state, such that said capacitor discharges through said switching element when said trigger means turns on said switching element.

2. A pulse generating circuit according to claim 1, wherein said trigger means is a diode connected between the collector of said transistor and the trigger terminal of said switching element.

3. A pulse generating circuit according to claim 1, wherein said trigger means is a resistor connected between the collector of said transistor and the trigger terminal of said switching element.

4. A pulse generating circuit according to claim 1, wherein said trigger means is a second transistor whose base-emitter is connected between the collector-base of the first transistor and whose collector is connected to the trigger terminal of said switching element.

5. A pulse generating circuit according to claim 1, wherein said trigger means is a N gate thyristor whose gate-anode are connected between the collector-base of said transistor and whose cathode is connected to the trigger terminal of said switching element.

6. A pulse generating circuit according to claim 1, wherein a pulse period adjusting resistor is connected between the base-emitter of said transistor.

7. A pulse generating circuit according to claim 1, wherein a trigger element is connected between the positive terminal of said capacitor and the trigger terminal of said switching element.

8. A pulse generating circuit according to claim 1, wherein the collector of said transistor is connected through a resistor to the contact of said resistor for charge and said capacitor.

9. A pulse generating circuit according to claim 1, wherein the collector of said transistor is connected through a resistor to the contact of said DC power source and said resistor for charge.

10. A pulse generating circuit according to claim 1, wherein the collector of said transistor is connected through a resistor to the contact of said load and said switching element.

11. A pulse generating circuit according to claim 1, wherein the base-emitter circuit of said transistor is connected in series to said resistor for charge.

12. A pulse generating circuit according to claim 1, wherein the base-emitter circuit of said transistor is connected in parallel to said resistor for charge.

13. A pulse generating circuit according to claim 12, wherein the collector of said transistor is connected through a resistor to the negative terminal of said DC power source.

14. A pulse generating circuit according to claim 1, wherein said load is a boost transformer.

15. A pulse generating circuit according to claim 1, wherein a starting switch is connected in series to said resistor for charge.

16. A pulse generating circuit according to claim 1, including a diode whose cathode is connected between the base-emitter of said transistor.

17. A pulse generating circuit according to claim 1, wherein said DC power source is a dry battery.

* * * * *